United States Patent [19]

Barre

[11] Patent Number: 5,099,142
[45] Date of Patent: Mar. 24, 1992

[54] TRIGGER CIRCUIT WITH SWITCHING HYSTERESIS

[75] Inventor: Claude Barre, München, Fed. Rep. of Germany

[73] Assignee: Siemens Aktiengesellschaft, Munich, Fed. Rep. of Germany

[21] Appl. No.: 581,453

[22] Filed: Sep. 11, 1990

[30] Foreign Application Priority Data

Sep. 11, 1989 [EP] European Pat. Off. ........ 89116799.1

[51] Int. Cl.⁵ .................. H03K 3/289; H03K 3/29
[52] U.S. Cl. .................. 307/272.2; 307/290; 307/455
[58] Field of Search .......... 307/272.2, 290, 291, 307/254, 455

[56] References Cited

U.S. PATENT DOCUMENTS

| | | | |
|---|---|---|---|
| 3,728,561 | 4/1973 | Brocker, Jr. | 307/272.2 |
| 4,485,312 | 11/1984 | Kusakabe et al. | 307/290 |
| 4,551,639 | 11/1985 | Takedo et al. | 307/272.2 |
| 4,560,888 | 12/1985 | Oida | 307/272.2 |
| 4,601,049 | 7/1986 | Wilhelm et al. | 307/272.2 |
| 4,628,216 | 12/1986 | Mazumder | 307/291 |
| 4,777,388 | 10/1988 | Widener | 307/442 |
| 4,810,908 | 3/1989 | Suzuki et al. | 307/455 |
| 4,977,335 | 12/1990 | Ogawa | 307/455 |
| 5,001,361 | 3/1991 | Tamamura et al. | 307/272.2 |

Primary Examiner—Stanley D. Miller
Assistant Examiner—T. Cunningham
Attorney, Agent, or Firm—Herbert L. Lerner; Laurence A. Greenberg

[57] ABSTRACT

A trigger circuit with switching hysteresis includes first, second and third current sources. A first transistor pair is supplied by the first current source and has transistors with coupled emitters, load circuits and input circuits. The input circuit of one of the transistors of the first pair is acted upon by a reference potential and the input circuit of the other of the transistors of the first pair being acted upon by an input signal. Load resistors are each connected in the load circuit of a respective one of the transistors of the first pair. A coupling resistor interconnects the load circuits of the transistors of the first pair. A second transistor pair is supplied by the second current source and has transistors with coupled emitters, load circuits directly coupled with corresponding load circuits of the transistors of the first pair and input circuits cross-coupled with corresponding load circuits of the transistors of the first pair. A third transistor pair is supplied by the third current source and has transistors with coupled emitters, load circuits and input circuits being coupled with corresponding load circuits of the transistors of the first pair. Further load resistors are each connected in the load circuit of a respective one of the transistors of the third pair.

4 Claims, 1 Drawing Sheet

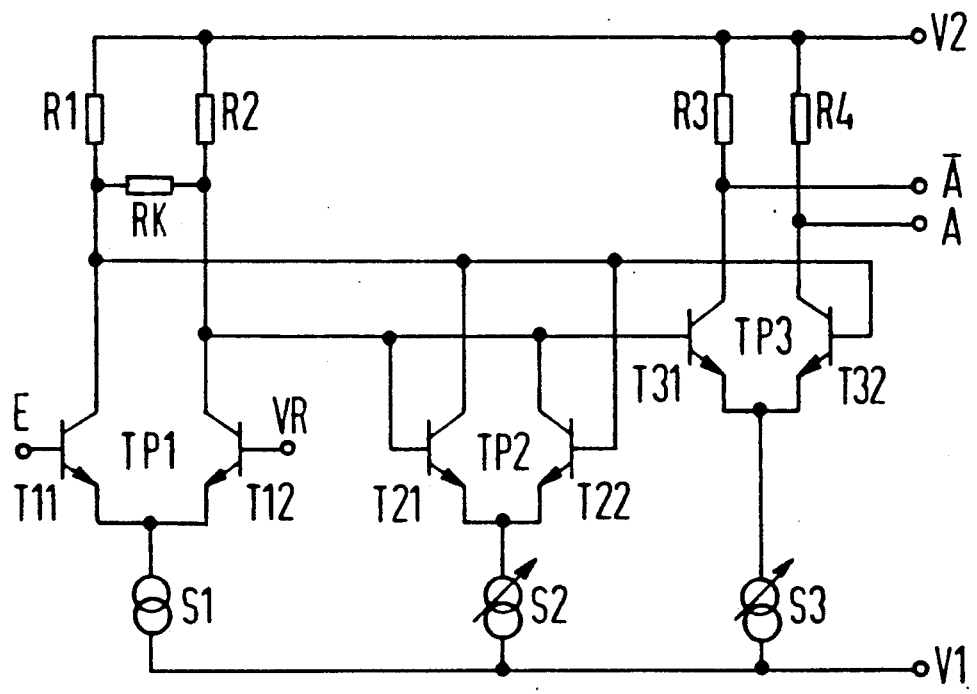

TRIGGER CIRCUIT WITH SWITCHING HYSTERESIS

The invention relates to a trigger circuit with switching hysteresis.

BACKGROUND AND PRIOR ART

The inputs of digital circuits, for example the inputs of gate arrays, are often preceded by trigger circuits that have switching hysteresis, firstly in order to increase the signal-to-noise ratio, particularly in the vicinity of the switching threshold, and secondly in order to enable the processing of input signals with slower edges as well. Preferred trigger circuits with switching hysteresis, also known as Schmitt triggers, are known for instance from the publication entitled Halbleiter-Schaltungstechnik [Semiconductor Circuitry] by U. Tietze and Ch. Schenk, 5th Edition, 1980, page 135. A Schmitt trigger is an emitter-coupled pair of transistors which is essentially operated with a constant emitter current, which has one load resistor in each load circuit of the pair, and which has positive feed back provided by a voltage divider between one of the two load circuits and the corresponding input circuit. If the circuit is suitably dimensioned, then it is possible to provide for the constant emitter current to change from one transistor to the other upon toggling, without driving the pair of transistors to saturation. As a result, there are no storage effects upon the changeover, and substantially higher switching frequencies are attainable.

However, it is precisely with gate arrays, as with numerous other digital circuits, that the signal levels associated with the logic states within the circuits often do not match the signal level at the input, making a level conversion necessary. Moreover, adaptation of the hysteresis course to the behavior of the input signal is also necessary in many cases. However, in the known trigger circuit, the degree of saturation of the transistors, the output signal level and the course of the hysteresis cannot be adjusted independently of one another, so that adjustment of the trigger circuit becomes problematic.

It is accordingly an object of the invention to provide a trigger circuit with switching hysteresis, which overcomes the hereinafore-mentioned disadvantages of the heretofore-known devices of this general type and with which the degree of saturation of the transistors, the output signal level and the course of hysteresis can be adjusted independently of one another.

SUMMARY OF THE INVENTION

With the foregoing and other objects in view there is provided a trigger circuit with switching hysteresis which includes first, second and third transistor parts having respective emitters, collectors and bases, wherein each of the transistor pairs is emitter coupled, wherein a first current source connects the emitters of the first transistor pair with a first supply potential, first and second load resistors connect the collectors of the first transistor pair with a second supply potential, a coupling resistor connects the two collectors, a control input is connected to the base of one of the transistors of the first transistor pair and a reference potential is connected to the base of the second transistor of the first transistor pair; wherein further a second current source is connected between the emitters of the second transistor pair and the second current source, and the collectors of the second transistor pair are connected to respective collectors of the first transistor pair, and the bases of the second transistor pair are cross-connected to respective collectors of the first transistor pair, and wherein the third current source is connected between the first supply potential and the emitters of the third transistor pair, two further load resistors are connecting respective collectors of the third transistor pair with the second supply potential, and the bases of the third transistor pair of cross-connected to the collectors of the first transistor pair.

In accordance with another feature of the invention, the reference potential is variable.

In accordance with a further feature of the invention, the third current source has a variable impressed current.

In accordance with a concomitant feature of the invention, at least one of the first and second current sources have a variable impressed current.

The advantages of the invention are that the trigger circuit can be combined with various types of logic, that differential inputs are attainable, and that the internal and external signal levels can be different.

Other features which are considered as characteristic for the invention are set forth in the appended claims.

Although the invention is illustrated and described herein as embodied in a trigger circuit with switching hysteresis, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE SINGLE FIGURE

The drawing is a schematic circuit diagram of a trigger circuit according to an exemplary embodiment of the invention.

DESCRIPTION OF THE PREFERRED EMBODIMENTS

Referring now in detail to the single figure of the drawing, there is seen a first pair TP1 of emitter-coupled transistors which is supplied by a first current source S1 and has first and second n-p-n transistors T11 and T12. The base of the first n-p-n transistor T11 is acted upon by an input signal E, and the base of the second n-p-n transistor T12 is acted upon by a reference potential VR. The load resistor R1 connects the collector of the first n-p-n transistor T11 to a supply potential V2, and the load resistor R2 also connects the collector of the second n-p-n transistor T12 to the supply potential V2. According to an embodiment of the invention, in order to prevent saturation, a coupling resistor RK is connected between the collectors of the first and second n-p-n transistors T11 and T12. Instead of the delta connection of load resistors R1, R2 and the coupling resistor RK shown, a Y connection is equally possible.

The exemplary embodiment also includes a second pair TP2 of emitter-coupled transistors, having third and fourth n-p-n transistors T21 and T22 which are supplied by a second current source S2. The base of the third n-p-n transistor T21 as well as the collector of the fourth n-p-n transistor T22 are connected to the collector of the second n-p-n transistor T12, and the base of the fourth n-p-n transistor T22 as well as the collector of the third n-p-n transistor T21 are connected to the collector of the first n-p-n transistor T11.

Finally, a third pair TP3 of emitter-coupled transistors having fifth and sixth n-p-n transistors T31 and T32 which are supplied by a third current source S3, is also provided. The base of the fifth n-p-n transistor T31 is connected to the collector of the second n-p-n transistor T12, and the base of the sixth n-p-n transistor T32 is connected to the collector of the first n-p-n transistor T11. The collectors of the fifth and sixth n-p-n transistors T31 and T32 are respectively acted upon through load resistors R3 and R4 by the supply potential V2. An output signal A is present at the collector of the sixth n-p-n transistor T32, and an output signal A that is inverted with respect to the output signal A is present at the collector of the fifth n-p-n transistor T31.

Each of the current sources S1, S2 and S3 are connected between the coupled emitters of a respective one of the transistor pairs TP1, TP2, TP3 and a first supply potential V1. According to an embodiment of the invention, the current sources S2 and S3 are externally variable current sources. The reference potential VR is likewise externally variable. The advantage of this is a variable adaptation to various input and output signal levels.

The adjustment of the input hysteresis level is effected by varying the reference voltage VR. The hysteresis width is determined by the ratio between the current of the second current source S2 and the current of the first current source S1. The output level of the trigger circuit is defined by the current output by the third current source S3. Regardless of any of these adjustments, the freedom from saturation of the circuit remains, which is defined by the load resistors R1, R2 in combination with the coupling resistor RK.

I claim:

1. A trigger circuit with switching hysteresis comprising a first, second and third pair of transistors, each pair of transistors being emitter-coupled, each transistor having a respective emitter, base and collector; a first and a second supply potential, and
   (a) a first current source connecting the emitter of each of the first pair of transistors with said first supply potential, a first and a second load resistor connecting the respective collector of the first pair of transistors with said second supply potential, a coupling resistor connecting the collector of each of the first pair of transistors to one another, a controlling input signal connected to the base of one of the first pair of transistors and a reference potential connected to the base of the other one of the first pair of transistors;
   (b) a second current source connecting the emitter of each of the second pair of transistors with said first supply potential, the collector of each of the second pair of transistors connected with a respective collector of each of the first pair of transistors, and the base of each of the second pair transistors cross-connected with a respective collector of the first pair of transistors; and
   (c) a third current source connecting each emitter of the third pair of transistors to the first supply potential, two further load resistors connecting the second supply potential to a respective collector of said third pair of transistors, and the base of each of the third pair of transistors connected to a respective collector of each of the first pair of transistors.

2. Trigger circuit according to claim 1, wherein the reference potential is adjustable.

3. Trigger circuit according to claim 1, wherein said third current source has a current which is adjustable.

4. Trigger circuit according to claim 1, wherein at least one of said second or third current sources has a current which is adjustable.

* * * * *